(12) United States Patent
Huang

(10) Patent No.: US 11,988,969 B2
(45) Date of Patent: May 21, 2024

(54) DISPATCH METHOD FOR PRODUCTION LINE IN SEMICONDUCTOR PROCESS, STORAGE MEDIUM AND SEMICONDUCTOR DEVICE

(71) Applicant: CHANGXIN MEMORY TECHNOLOGIES, INC., Hefei (CN)

(72) Inventor: Chin-Chang Huang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 448 days.

(21) Appl. No.: 17/442,690

(22) PCT Filed: May 26, 2021

(86) PCT No.: PCT/CN2021/095901
§ 371 (c)(1),
(2) Date: Sep. 24, 2021

(87) PCT Pub. No.: WO2021/254111
PCT Pub. Date: Dec. 23, 2021

(65) Prior Publication Data
US 2023/0057823 A1    Feb. 23, 2023

(30) Foreign Application Priority Data

Jun. 19, 2020  (CN) .......................... 202010566033.8

(51) Int. Cl.
*G03F 7/00* (2006.01)
*G03F 1/70* (2012.01)

(52) U.S. Cl.
CPC ............ *G03F 7/70633* (2013.01); *G03F 1/70* (2013.01); *G03F 7/70525* (2013.01); *G03F 7/70891* (2013.01)

(58) Field of Classification Search
USPC ..................................... 430/22, 30
See application file for complete search history.

(56) References Cited

U.S. PATENT DOCUMENTS

| | | | |
|---|---|---|---|
| 7,262,831 | B2 | 8/2007 | Akhssay et al. |
| 8,681,309 | B2 | 3/2014 | Baselmans et al. |
| 2002/0036758 | A1 | 3/2002 | de Mol et al. |
| 2009/0215206 | A1 | 8/2009 | Singhal et al. |

FOREIGN PATENT DOCUMENTS

| | | |
|---|---|---|
| CN | 101750905 A | 6/2010 |
| CN | 102411267 A | 4/2012 |
| CN | 103199040 A | 7/2013 |
| CN | 104898378 A | 9/2015 |
| CN | 207557646 U | 6/2018 |
| CN | 106158696 B | 12/2018 |

OTHER PUBLICATIONS

International Search Report cited in PCT/CN2021/095901 dated Aug. 4, 2021, 8 pages.

*Primary Examiner* — Christopher G Young
(74) *Attorney, Agent, or Firm* — Cooper Legal Group, LLC

(57) ABSTRACT

The present application relates to a dispatch method for a production line in a semiconductor process, a storage medium and a semiconductor device. The dispatch method for a production line in a semiconductor process can acquire an overlay error reference curve of a product lot to be exposed in equipment and set an overlay error range according to the overlay error reference curve. At the end of exposure, an overlay error for the product lot to be exposed can be acquired, and it can be determined whether the overlay error falls into the overlay error range. If the overlay error for the product lot to be exposed does not fall into the overlay error range, the product lot to be exposed can be continuously machined by this equipment.

14 Claims, 3 Drawing Sheets

DISPATCH METHOD FOR PRODUCTION LINE IN SEMICONDUCTOR PROCESS, STORAGE MEDIUM AND SEMICONDUCTOR DEVICE

CROSS-REFERENCE TO RELATED APPLICATIONS

The present application claims the priority to the Chinese Patent Application No. 202010566033.8, titled "DISPATCH METHOD FOR PRODUCTION LINE IN SEMICONDUCTOR PROCESS, STORAGE MEDIUM AND SEMICONDUCTOR DEVICE", filed to the State Intellectual Property Office of People's Republic of China on Jun. 19, 2020, which is incorporated herein by reference in its entirety.

TECHNICAL FIELD

The present application relates to a dispatch method for a production line in a semiconductor process, a storage medium and a semiconductor device.

BACKGROUND

In the semiconductor manufacturing process, usually, a real time dispatch (RTD) system is used to dispatch product lots to be machined to a plurality of equipment and adjust the exposure sequence of the product lots to be machined in the equipment.

In a conventional scheme, the built-in algorithm used by the RTD system usually only focuses on information such as the time gap (Q-time) between product lots in different processes, the importance of product lots (speedup/KANBAN) and the lot data of the first product lot (Targeting), but ignores the production conditions of the previous and next product lots, resulting in a reduced yield of product lots.

SUMMARY

The present application provides a dispatch method for a production line in a semiconductor process, comprising following steps:
  acquiring an overlay error reference curve of a product lot to be exposed in equipment;
  setting an overlay error range according to the overlay error reference curve; acquiring an overlay error for the product lot to be exposed after exposure;
  determining whether the overlay error falls into the overlay error range; and
  pre-cooling the equipment if the overlay error falls into the overlay error range.

Based on the same inventive concept, the present application further provides a computer-readable storage medium storing computer programs that implement, when executed by a processor, the steps in the method described in any one of the above embodiments.

Based on the same inventive concept, the present application further provides a semiconductor device, comprising a memory and a processor, the memory storing computer programs that are runnable on the processor, the processor implementing the steps in the method described in any one of the above embodiments when executing the computer programs.

The dispatch method for a production line in a semiconductor process according to the present application can acquire an overlay error reference curve of a product lot to be exposed in equipment and set an overlay error range according to the overlay error reference curve. At the end of exposure, an overlay error for a product lot to be exposed can be acquired, and it can be determined whether the overlay error falls into the overlay error range. After the overlay error for the product lot to be exposed does not fall into the overlay error range, it is indicated that the difference in exposure energy between two adjacent product lots machined by the equipment is within an acceptable range, so that the yield of semiconductor products will not be affected, and the product lot to be exposed can be continuously exposed by the equipment. If the overlay error for the product lot to be exposed falls into the overlay error range, it is indicated that there is a large difference in exposure energy between two adjacent product lots machined by this equipment, and the equipment needs to be pre-cooled, thereby allowing the overlay error to be within an acceptable range and ensuring the yield of semiconductor products.

BRIEF DESCRIPTION OF THE DRAWINGS

In order to explain technical solutions of embodiments of the present application or in the prior art more clearly, the drawings to be used for describing the embodiments or the prior art will be introduced simply. Apparently, the drawings to be described below are merely some embodiments of the present application, and a person of ordinary skill in the art may further obtain other drawings according to these drawings without paying any creative effort.

DETAILED DESCRIPTION

Figure 1:
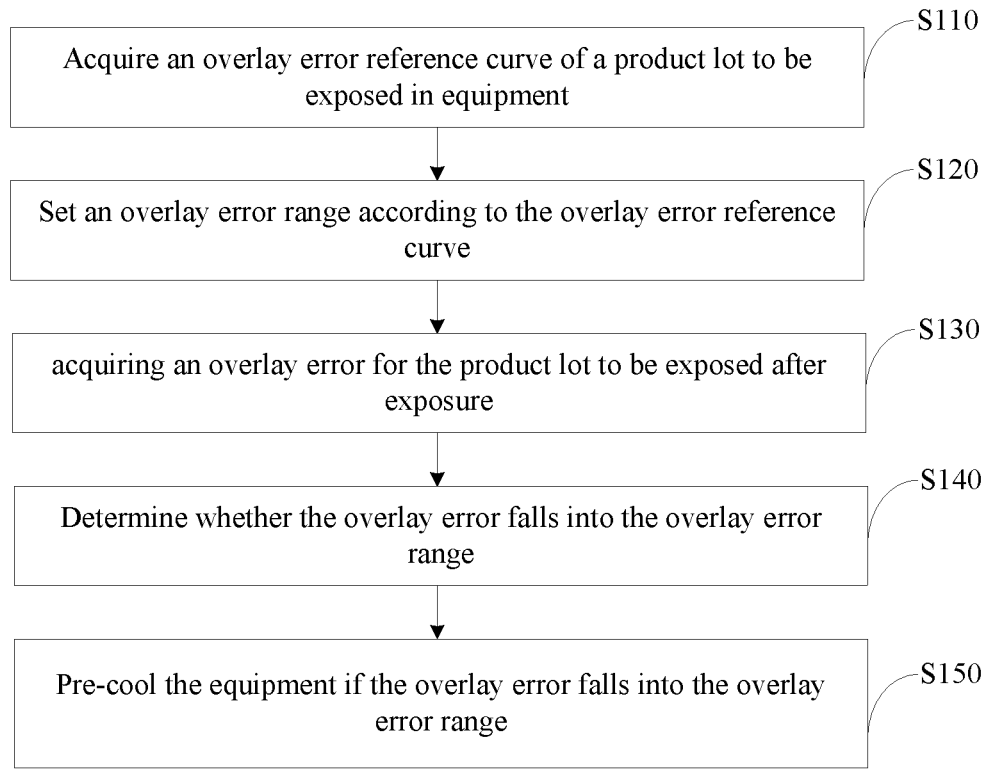
FIG. 1 is a flowchart of a dispatch method for a production line in a semiconductor process according to an embodiment of the present application.

In order to facilitate the understanding of the present application, the present application will be described more fully below with reference to the relevant drawings. The preferred embodiments of the present application are shown in the drawings. However, the present application may be implemented in many different forms and is not limited to the embodiments described herein. On the contrary, these embodiments are provided to make the disclosure of the present application more thorough and comprehensive.

Unless otherwise defined, all technical and scientific terms used herein have the same meanings as those commonly understood by those skilled in the art to which the present application belongs. The terms used in the specification of the present application are only for describing specific embodiments, rather than limiting the present application.

Here, the terms indicating a spatial relationship, such as "under", "underneath", "lower", "below", "above" and "upper", can be used for describing a relationship between one element or feature shown in the drawing and other elements or features. It should be understood that, in addition to the orientation shown in the drawings, the terms indicating the spatial relationship further include different orientations of the device in use and operation. For example, if the device in the drawing is turned upside down, the element or feature described as being "underneath" or "below" other element will be oriented to be "above" the other element or feature. Therefore, the exemplary terms "underneath" and "below" may include up and down orientations. In addition, the device may also include additional orientations (e.g., rotated at 90 degrees or other orientations), and the spatial description used herein are interpreted correspondingly.

As used herein, the singular form "a", "an" and "said/the" may include plural forms, unless the context clearly indicates otherwise. It should be further understood that the terms "consisting of" and/or "including/comprising" specify the presence of the stated features, integers, steps, operations, elements and/or components, but do not exclude the presence or addition of one or more other features, integers, steps, operations, elements, components and/or combinations thereof. Meanwhile, as used herein, the term "and/or" includes any and all combinations of the related items listed.

The lens heating (LH) effect is a phenomenon that the lens is heated after absorbing heat during exposure so that the image parameters obtained by lithography are changed. In the semiconductor production process, a laser beam is projected onto a lens through a photomask and then onto a wafer through the lens, so that the lithography in the semiconductor production process can be completed. However, the photomask and particular illumination mode used in the lithography process will make some parts of the lens absorb more heat than other parts, that is, the lens heating effect is produced. It should be understood that, as the lens is used for a longer time, the lens heating effect is more obvious, and the image parameters formed after exposure will be further affected.

Therefore, in the semiconductor field, the exposure energy of each product lot in the equipment before and after exposure will affect the yield of the product lot. For example, when an equipment in a semiconductor production line (a photomask is located inside the equipment) exposes two adjacent product lots to be exposed at high exposure energy and low exposure energy with a large energy difference therebetween or continuously expose a plurality of product lots to be exposed at high exposure energy, the quality of the product lots will be affected an the yield of the product lots is reduced.

Referring to FIG. 1, in view of the above problem, the present application provides a dispatch method for a production line in a semiconductor process. The dispatch method for a production line in a semiconductor process comprises following steps:

S110: acquiring an overlay error reference curve of a product lot to be exposed in equipment;
S120: setting an overlay error range according to the overlay error reference curve;
S130: acquiring an overlay error for the product lot to be exposed after exposure;
S140: determining whether the overlay error falls into the overlay error range; and
S150: pre-cooling the equipment if the overlay error falls into the overlay error range.

The dispatch method for a production line in a semiconductor process according to the present application can acquire an overlay error reference curve of a product lot to be exposed in equipment and set an overlay error range according to the overlay error reference curve. At the end of exposure, an overlay error for the product lot to be exposed can be acquired, and it can be determined whether the overlay error falls into the overlay error range. After the overlay error for the product lot to be exposed does not fall into the overlay error range, it is indicated that the difference in exposure energy between two adjacent product lots machined by the equipment is within an acceptable range, so that the yield of semiconductor products will not be affected, and other reserved product lots to be exposed can be continuously exposed by the equipment. If the overlay error for the product lot to be exposed falls into the overlay error range, it is indicated that there is a large difference in exposure energy between two adjacent product lots machined by the equipment. For example, the exposure energy of the previous product lot is far higher than that of the next adjacent product lot. At this time, the equipment needs to be pre-cooled, so that the overlay error is within an acceptable range and the yield of semiconductor products is ensured.

Figure 2:
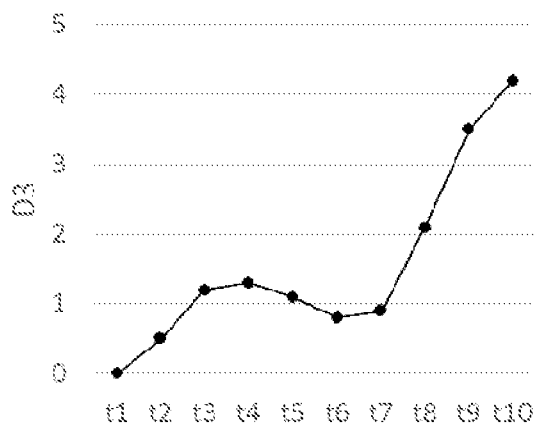
FIG. 2 is a third-order distortion overlay error reference curve of a product lot to be exposed on equipment obtained in the dispatch method for a production line in a semiconductor process according to an embodiment of the present application.

Referring to FIG. 2, in one embodiment, in S110, an RTD system can acquire an overlay error reference curve of a product lot to be exposed on equipment. In one embodiment, the overlay error reference curve may be a third-order distortion (D3) overlay error reference curve. The third order in the D3 is that the overlay error changes in a third power (or third order) with the increase of the distance to the center point. It should be understood that, since the equipment exposes a product lot to be exposed, the RTD system will confirm the best process window for the product lot to be exposed or each process, so the best exposure energy of the used process and the third-order distortion overlay error reference curve can be obtained before exposure of the product lot to be exposed.

In one embodiment, the setting an overlay error range according to the overlay error reference curve comprises:

S121: setting an overlay error threshold according to the climbing speed and saturation level of a third-order distortion overlay error in the third-order distortion overlay error reference curve; and
S122: setting the overlay error range according to the overlay error threshold, the maximum value in the overlay error range being less than the overlay error threshold.

In one embodiment, in S121, since the exposure energy will affect the climbing speed of D3 and the level reached during saturation, it can be known from the semiconductor products machined by the equipment or the semiconductor machining experience that the exposure to subsequent product lots may be affected when the D3 is greater than a certain value, that is, the overlay error threshold can be set accordingly.

In one embodiment, in S122, since the equipment needs to pre-cooled before the D3 reaches the overlay error threshold, an overlay error range can be set according to the overlay error threshold. It is to be noted that the maximum value in the overlay error range is less than the overlay error threshold. If the overlay error for the current product lot falls into the overlay error range, that is, it is indicated that the current exposure energy of the equipment is too high, the yield of subsequent product lots may be affected. Therefore, when the overlay error for the current product lot does not reach the overlay error threshold and is within the overlay error range, the equipment can be pre-cooled by the RTD system, thereby weakening the lens heating effect and ensuring the yield of subsequent product lots. It should be understood that, since the maximum value in the overlay error range is less than the overlay error threshold, the overlay error range can be set to avoid the problem of reduced yield of subsequent product lots caused by the insufficient accuracy of the overlay error threshold, so that the yield of subsequent product lots can be ensured to the largest extent.

In one embodiment, the pre-cooling the equipment comprises:

S151: controlling the equipment to expose a debugging product lot or wait for a preset time before exposing a next product lot. In this embodiment, by delivering a debugging product lot to the equipment for exposure or allowing the equipment to wait for a preset time before exposing a next product lot, the difference in exposure energy between two adjacent product lots machined by the equipment can be reduced, and the lens heating effect can be weakened, thereby allowing the overlay error to be within an acceptable range and ensuring the yield of semiconductor products.

In one embodiment, in S151, after the equipment exposures a product lot with high exposure energy, the equipment may expose a debugging product lot before exposing a subsequent product lot with low exposure energy, wherein the debugging product lot refers to a process and non-product block control piece that will not be affected by the conversion from high exposure energy to low exposure energy. It should be understood that the equipment may also expose the debugging layer by a block control piece after exposing high exposure energy process layer by a wafer and before exposing a subsequent low exposure energy process layer.

In one embodiment, the debugging product lot cannot be the same as the previous product lot with high exposure energy and the next product lot with low exposure energy, and a debugging product lot with exposure energy between the product lot with high exposure energy and the product lot with low exposure energy may be selected for exposure debugging. For example, if the high energy exposure of the previous product lot is 100 and the low exposure energy of the next product lot is 40, a debugging product lot with exposure energy within an intermediate range of 40 to 100 (e.g., 60 to 70) may be selected for exposure. In this embodiment, the equipment exposes the product lot with low exposure energy of 40 after exposing the debugging product lot, so that there will be no excessive difference in exposure energy, the lens heating effect can be weakened, and the yield of the product lot with low exposure energy of 40 can be ensured.

In one embodiment, in S151, when the equipment exposures a product lot with high exposure energy, the equipment is allowed to wait for a preset time before exposing a subsequent product lot with low exposure energy. It should be understood that the lens in the equipment can be cooled within the preset time, so that the lens heating effect can be weakened to a certain extent and the yield of the subsequent product lot with low exposure energy can be ensured. The preset time may be set according to actual needs. In one embodiment, the preset time may be, but not limited to, two times of the OPStart time gap between two adjacent product lots. It is to be noted that the subsequent product lot with low exposure energy can be started only after the debugging product lot is exposed. If the process of exposing the debugging product lot is cancelled, the process of exposing the subsequent product lot with low exposure energy is also to be cancelled.

In one embodiment, the method further comprises: before controlling the equipment to expose a debugging product lot, S051: acquiring a first exposure energy of a pervious product lot and a second exposure energy of the product lot to be exposed, the previous product lot being an exposed product lot adjacent to the product lot to be exposed; and S052: determining a third exposure energy of the debugging product lot according to the first exposure energy and the second exposure energy, the third exposure energy being between the first exposure energy and the second exposure energy.

In one embodiment, the debugging product lot functions to reduce the span between the first exposure energy of the previous product lot and the second exposure energy of the product lot to be exposed. Therefore, the third exposure energy of the debugging product lot needs to be between the first exposure energy and the second exposure energy in order to reduce the span between the exposure energy of the previous product lot and the exposure energy of the product lot to be exposed.

In one embodiment, after determining the debugging product lot according to the first exposure energy and the second exposure energy, the method further comprises:

S0521: setting the wafer count of the debugging product lot according to a difference between the first exposure energy of the previous product lot and the second exposure energy of the product lot to be exposed. The previous product lot is an exposed product lot adjacent to the product lot to be exposed. It should be understood that there are too few wafers in the debugging product lot, the lens cooling effect in the equipment will not be obvious. In this embodiment, the wafer count of the debugging product lot is set according to the difference between the first exposure energy of the previous product lot and the second exposure energy of the product lot to be exposed, so that the lens cooling effect after exposure of the debugging product lot can satisfy the requirements for a subsequent product lot to be exposed, and the yield of the subsequent product lot to be exposed is thus ensured.

In the technical field of semiconductors, the recipe refers to multiple steps of process machining in the automatic semiconductor production process, various process parameter values of each step and the duration of each step. Since repeated execution of a same recipe by the same equipment will lead to continuous high exposure energy, the quality and yield of product lots machined by this equipment are affected. In one embodiment, the method further comprises: before acquiring an overlay error for the product lot to be exposed after exposure, S011: determining whether the wafer count of a product lot with high exposure energy continuously exposed by the equipment exceeds a preset wafer count, the product lot with high exposure energy being a product lot to be exposed with exposure energy greater than a preset exposure energy; and S012: cooling the equipment if the wafer count of the product lot with high exposure energy is greater than the preset wafer count. In one embodiment, the cooling the equipment comprises: adjusting the sequence of the product lot to be exposed.

In one embodiment, in S011, a threshold for distinguishing the high exposure energy from the low exposure energy can be set, that is, the product lot with high exposure energy is defined as a product lot with exposure energy greater than the preset exposure energy. In this embodiment, the RTD system can record the exposure energy of the exposed product lot, and determine whether the wafer count of the product lot with high exposure energy is greater than the preset wafer count so as to determine whether the equipment satisfies the conditions for continuous product at high exposure energy. The preset wafer count may be set according to actual needs.

In one embodiment, in S012, when the wafer count of the product lot with high exposure energy is greater than the preset wafer count, the equipment has satisfied the conditions for continuous production at high exposure energy. At this time, the quality of product lots will be affected if the equipment is continuously controlled to machine a subsequent product lot to be exposed, so that the yield of the subsequent product lot to be exposed is reduced. Therefore, it is necessary to cool the equipment. In one embodiment, by adjusting the sequence of the product to be exposed, i.e., by dispatching a product lot with low exposure energy to the equipment by the RTD system, the lens heating effect caused by continuous product of the equipment at high exposure energy can be weakened.

In one embodiment, the method further comprises: before cooling the equipment to adjust the sequence of the product lot to be exposed,
S013: determining whether the equipment has been reserved for the product lot to be exposed; and
S014: adjusting the product lot to be exposed if the equipment has been reserved for the product lot to be exposed.

In one embodiment, in S013, firstly, it can be determined whether the equipment has been reserved for the product lot to be exposed. The RTD system can cool the equipment by different methods according to the product lot to be exposed reserved by the equipment.

In one embodiment, in S014, the adjusting the product lot to be exposed comprises:
S0141: acquiring a first lot number of a previous product lot before the product lot to be exposed and a second lot number of a next product lot after the product lot to be exposed; and
S0142: exchanging the exposure sequence of a candidate product lot with a third lot number and the product lot to be exposed, the third lot number being different from the first lot number and the second lot number.

In one embodiment, in order to avoid continuous exposure of product lots with the same exposure energy, the product lot to be exposed can be exchanged with a candidate product lot with other exposure energy when the wafer count of the product lot to be exposed exceeds the preset wafer count. Therefore, the third lot number of the candidate product lot may be different from the first lot number and the second lot number.

In one embodiment, if the equipment has been reserved for the product lot to be exposed, the equipment can be controlled by the RTD system to preferentially expose a product lot with low exposure energy, in order to avoid the problem of reduced yield caused by product lots with high exposure energy continuously machined by the equipment. If there is no product lot with low exposure energy among the product lots to be exposed reserved by the equipment, the products can be dispatched to the equipment by RTD system, in order to ensure the presence of product lots with low exposure energy among the product lots to be exposed reserved by the equipment. Alternatively, when there is no product lot with low exposure energy among the product lots to be exposed reserved by the equipment, machining can also be performed according to the situation where the equipment has not been reserved for product lots to be exposed, that is, it is necessary to allow the equipment to wait for a preset time according to actual needs.

Figure 3:
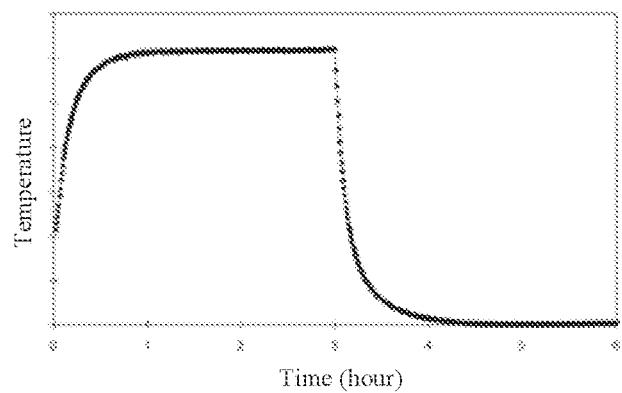
FIG. 3 is a lens heating and cooling curve in the dispatch method for a production line in a semiconductor process according to an embodiment of the present application.

Referring to FIG. 3, in one embodiment, the method further comprises: before controlling the equipment to wait for a preset time,
S053: setting the preset time that the equipment needs to wait according to a lens heating and cooling curve of the equipment. In this embodiment, the preset time that the equipment needs to wait can be set according to the lens heating and cooling curve of the equipment. Specifically, the preset time can be set according to actual needs. It should be understood that, since the production time for each product lot is about 20 min, it can be ensured that subsequent product lots or processes are normal when the preset time that the equipment needs to wait exceeds (but not limited to) 1 hour. Therefore, in one embodiment, the preset time that the equipment needs to wait may be greater than 1 hour.

Figure 4:
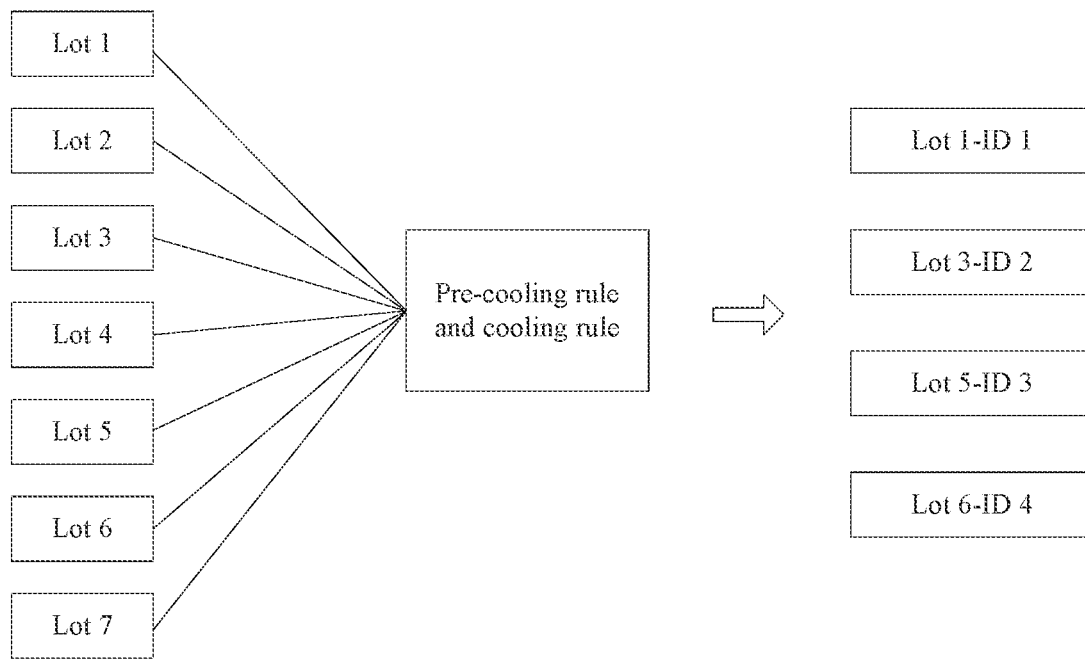
FIG. 4 is a schematic diagram of a method for screening different product lots of a reserved equipment by a pre-cooling rule and a cooling rule in the dispatch method for a production line in a semiconductor process according to an embodiment of the present application.

Referring to FIG. 4, in one embodiment, the algorithm built in the RTD system can adjust the batch ID of different product lots by setting a pre-cooling rule and a cooling rule for the equipment. According to the embodiments of pre-cooling and cooling the equipment, it can be known that the pre-cooling rule and the cooling rule can correspond to different lens heating settings and can be used to screen product lots to be exposed reserved for the equipment, so that the yield of the product lots to be exposed entering the equipment can be ensured by pre-cooling and cooling. In this embodiment, before reservation of a product lot, the RTD system can determine whether the process parameters of this product lot satisfy the pre-cooling rule and cooling rule corresponding to the equipment to be reserved. If the process parameters of the product lot satisfy the pre-cooling rule and cooling rule corresponding to the equipment to be reserved, the yield of the product lot after exposure cannot be ensured by pre-cooling or cooling the machine, the RDT system will not give a batch ID for the product lot in this equipment. For example, as shown in FIG. 4, since lots 2, 4 and 7 do not satisfy the pre-cooling rule and cooling rule of the equipment, the RTD system does not give batch IDs for the three lots in this equipment.

Figure 5:
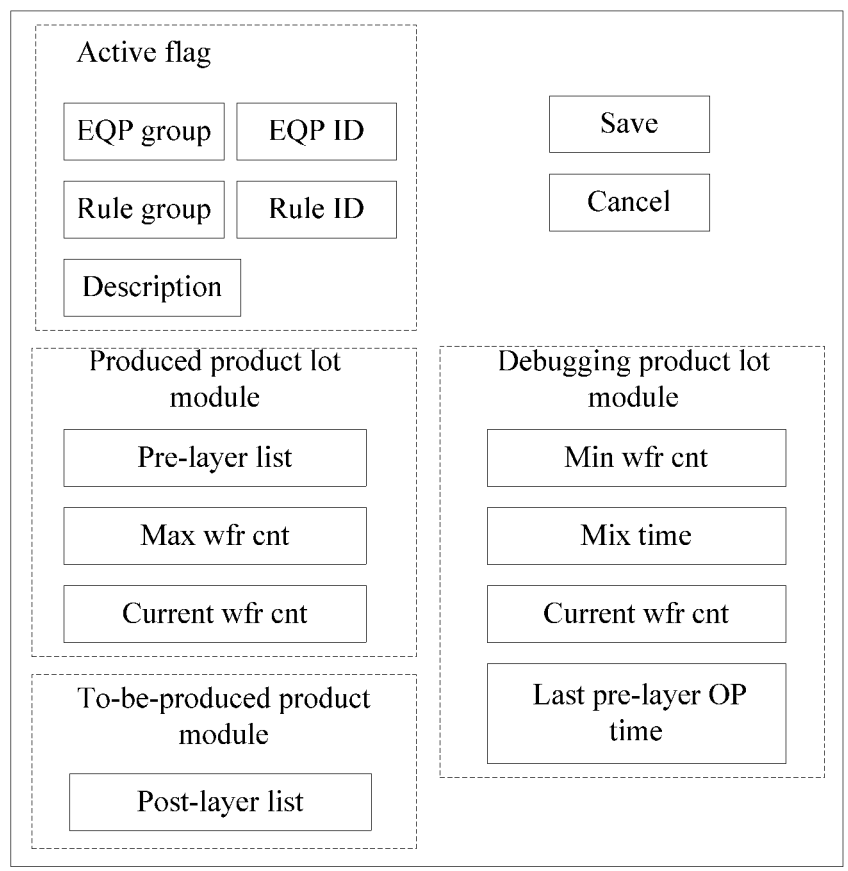
FIG. 5 is a schematic diagram of a software interface of the dispatch method for a production line in a semiconductor process according to an embodiment of the present application.

Referring to FIG. 5, in one embodiment, the software control interface o the RTD system may comprise a plurality of modules and buttons SAVE and CANCEL.

The first module is an active flag module and can be selected by ticking. The first module may comprise EQP groups, EQP IDs, rule groups, rule IDs and description. The EQP groups may be a pull-down menu, and the EQP IDs may be selected. Multiple EQP IDs or all EQP IDs may be selected simultaneously. When all EQP IDs are selected, all EQP groups form a synchronous group. The rule groups may also be a pull-down menu, and the pre-cooling rules or cooling rules for equipment may be selected. The rule ID may be input manually, but the rule ID for a same EQP group cannot be duplicated. That is, only one dispatch rule can be used at the same moment. The description may be input manually, and the maximum byte may be less than 128 bits.

The second module is a produced product lot module, and may comprise a produced product lot list (Pre-Layer List), a maximum wafer count (max wfr cnt) and a current wafer count (current wfr cnt). After the button Pre-Layer List is pressed down, the recipe name can be popped up, and the produced product lot can be inquired by searching or manually inputting, wherein the searching can support double star and fuzzy contrast except for xxx. Since the product lot satisfying the cooling rule refers to a product lot that will be abnormal in the case of continuous high exposure energy and the product lot satisfying the cooling rule refers to a product lot that will be abnormal when the high exposure energy and the low exposure energy are exchanged, some products within the cooling rule may be included in the pre-cooling rule. Therefore, when the cooling rule is selected in the rule group, the max wfr cnt may be input manually; and, when the pre-cooling rule is selected in the rule group, the max wfr cnt cannot be input. The current wfr cnt can show the wafer count of wafers operated in this EQP group, and can be modified manually.

The third module is a debugging product lot module, and may comprise a minimum wafer count (min wfr cnt), a debugging product lot duration (mix time), a current wafer count (current wfr cnt) and a last to-be-machined product lot operation time (last pre-layer OP time). The min wfr cnt may be input manually, and the mix time is the time when the debugging product lot is inserted between two adjacent product lots, with a unit of minute. The current wfr cnt can show the wafer count of wafers operated in this EQP group, and can be modified manually. The last pre-layer OP time can show the time when the last product lot to be machined is operated, and can be defaulted as the current time and modified manually.

The fourth module is a to-be-produced product, and may comprise a to-be-produced product lot list (Post-Layer List). After the button Post-Layer List is pressed down, the recipe name can be popped up, and the produced product lot can be inquired by searching or manually inputting, wherein the searching can support double star and fuzzy contrast except for xxx.

Based on the same inventive concept, the present application further provides a computer-readable storage medium storing computer programs that implement, when executed by a processor, the steps in the method described in any one of the above embodiments.

Based on the same inventive concept, the present application further provides a semiconductor device, comprising a memory and a processor, the memory storing computer programs that are runnable on the processor, the processor implementing the steps in the method described in any one of the above embodiments when executing the computer programs.

Various technical features of the above embodiments can be arbitrarily combined. For simplicity, all possible combinations of various technical features in the above embodiments are not described. However, all combinations of these technical features shall fall into the scope recorded by this specification if not conflicted.

The above embodiments merely show several implementations of the present application. The description of these embodiments is specific and detailed relatively, but cannot be interpreted as limiting the patent scope of the present application. It should be noted that, for a person of ordinary skill in the art, several variations and improvements can be made without departing from the concept of the present application, and all the variations and improvements shall fall into the protection scope of the present application. Therefore, the protection scope of the present application should be subject to the appended claims.

The invention claimed is:

1. A dispatch method for a production line in a semiconductor process, comprising:
   acquiring an overlay error reference curve of a product lot to be exposed in equipment;
   setting an overlay error range according to the overlay error reference curve;
   acquiring an overlay error for the product lot to be exposed after exposure;
   determining whether the overlay error falls into the overlay error range; and
   pre-cooling the equipment if the overlay error falls into the overlay error range.

2. The dispatch method for a production line in a semiconductor process according to claim 1, wherein the pre-cooling the equipment comprises:
   controlling the equipment to expose a debugging product lot or wait for a preset time before exposing a next product lot.

3. The dispatch method for a production line in a semiconductor process according to claim 1, further comprising:
   before acquiring an overlay error for the product lot to be exposed after exposure,
   determining whether a wafer count of a product lot with high exposure energy continuously exposed by the equipment exceeds a preset wafer count, the product lot with high exposure energy being a product lot to be exposed with exposure energy greater than a preset exposure energy; and
   cooling the equipment if the wafer count of the product lot with high exposure energy is greater than the preset wafer count.

4. The dispatch method for a production line in a semiconductor process according to claim 3, wherein the cooling the equipment comprises:
   adjusting the sequence of the product lot to be exposed.

5. The dispatch method for a production line in a semiconductor process according to claim 1, wherein the overlay error reference curve is a third-order distortion overlay error reference curve.

6. The dispatch method for a production line in a semiconductor process according to claim 5, wherein the setting an overlay error range according to the overlay error reference curve comprises:
   setting an overlay error threshold according to a climbing speed and saturation level of a third-order distortion overlay error in the third-order distortion overlay error reference curve; and
   setting the overlay error range according to the overlay error threshold, a maximum value in the overlay error range being less than the overlay error threshold.

7. The dispatch method for a production line in a semiconductor process according to claim 2, further comprising:
   before controlling the equipment to expose a debugging product lot,
   acquiring a first exposure energy of a previous product lot and a second exposure energy of the product lot to be exposed, the previous product lot being an exposed product lot adjacent to the product lot to be exposed; and
   determining a third exposure energy of the debugging product lot according to the first exposure energy and the second exposure energy, the third exposure energy being between the first exposure energy and the second exposure energy.

8. The dispatch method for a production line in a semiconductor process according to claim 7, further comprising: after determining the debugging product lot according to the first exposure energy and the second exposure energy,
   setting the wafer count of the debugging product lot according to a difference between the first exposure energy of the previous product lot and the second exposure energy of the product lot to be exposed.

9. The dispatch method for a production line in a semiconductor process according to claim 4, further comprising: before adjusting the sequence of the product lot to be exposed,
   determining whether the equipment has been reserved for the product lot to be exposed; and
   adjusting the product lot to be exposed if the equipment has been reserved for the product lot to be exposed.

10. The dispatch method for a production line in a semiconductor process according to claim 9, wherein the adjusting the product lot to be exposed comprises:
   acquiring a first lot number of a previous product lot before the product lot to be exposed and a second lot number of a next product lot after the product lot to be exposed; and
   exchanging the exposure sequence of a candidate product lot with a third lot number and the product lot to be exposed, the third lot number being different from the first lot number and the second lot number.

11. The dispatch method for a production line in a semiconductor process according to claim 2, further comprising: before controlling the equipment to wait for a preset time,
   setting the preset time that the equipment needs to wait according to a lens heating and cooling curve of the equipment.

12. The dispatch method for a production line in a semiconductor process according to claim 11, wherein the preset time is greater than one hour.

13. A computer-readable storage medium storing computer programs that implement, when executed by a processor, the steps in the method according to claim 1.

14. A semiconductor device, comprising a memory and a processor, the memory storing computer programs that are runnable on the processor, the processor implementing the steps in the method according to claim 1 when executing the computer programs.

* * * * *